(12) United States Patent
Hsieh

(10) Patent No.: US 7,786,543 B2
(45) Date of Patent: *Aug. 31, 2010

(54) CDS CAPABLE SENSOR WITH PHOTON SENSING LAYER ON ACTIVE PIXEL CIRCUIT

(75) Inventor: Tzu-Chiang Hsieh, Freemont, CA (US)

(73) Assignee: e-Phocus, San Jose, CA (US)

( * ) Notice: Subject to any disclaimer, the term of this patent is extended or adjusted under 35 U.S.C. 154(b) by 475 days.

This patent is subject to a terminal disclaimer.

(21) Appl. No.: 11/893,828

(22) Filed: Aug. 17, 2007

(65) Prior Publication Data

US 2007/0285545 A1 Dec. 13, 2007

Related U.S. Application Data

(63) Continuation-in-part of application No. 10/229,953, filed on Aug. 27, 2002, now abandoned, and a continuation-in-part of application No. 10/229,955, filed on Aug. 27, 2002, now Pat. No. 7,411,233.

(51) Int. Cl.
*H01L 31/00* (2006.01)

(52) U.S. Cl. ............. 257/444; 257/448; 257/458; 257/226; 257/227; 257/53; 257/292; 257/E27.133

(58) Field of Classification Search ............ 257/444, 257/448, 458, 226, 227, 53, 292, E27.133
See application file for complete search history.

(56) References Cited

U.S. PATENT DOCUMENTS

2009/0224351 A1* 9/2009 Hsieh ................. 257/444

\* cited by examiner

*Primary Examiner*—Tan N Tran
(74) *Attorney, Agent, or Firm*—John R. Ross

(57) ABSTRACT

A MOS or CMOS based active pixel sensor with special sampling features to substantially eliminate clock noise. The sensor includes an array of pixels fabricated in or on a substrate, each pixel defining a charge collection node on which charges generated inside a photodiode region are collected, a charge integration node, at which charges generated in said pixel are integrated to produce pixel signals, a charge sensing node from which reset signals and the pixel signals are sensed. In preferred embodiments the sensor includes a continuous electromagnetic radiation detection structure located above the pixel circuits providing a photodiode region for each pixel. The sensor includes integrated circuit elements adapted to maintain voltage potentials of the charge integration nodes substantially constant during charge integration cycles. The sensor also includes integrated circuit elements having electrical capacitance adapted to store charges providing an electrical potential at the charge integration node. In preferred embodiments this is a pinned diode.

34 Claims, 8 Drawing Sheets

CDS CAPABLE SENSOR WITH PHOTON SENSING LAYER ON ACTIVE PIXEL CIRCUIT

CROSS REFERENCE TO RELATED APPLICATIONS

This application is a continuation-in-part of U.S. patent applications Ser. No. 10/229,953 filed Aug. 27, 2002 now abandoned and Ser. No. 10/229,955 filed Aug. 27, 2002 now U.S. Pat. No. 7,411,233.

The present invention relates to CMOS imaging sensors and in particular to such sensors with special sampling features.

BACKGROUND OF THE INVENTION

Prior Art Pinned Photodiode Sensors

Pinned photodiodes sensors are well known in the prior art. Following are examples of patents describing CMOS sensors employing pinned photodiodes: U.S. Pat. Nos. 5,625,210; 5,880,495; 5,904,493; 6,297,070; 6,566,697; 6,967,120; and 7,115,855. All of these patents are incorporated herein by reference.

Constant Gate Bias Transistors

Operation of transistors with constant gate bias is a well known technique used to maintain the source voltage of a transistor at a constant value. For example, for n-type transistors operated with 3.3 supply voltage, a gate voltage at a about 0.7 volts (the threshold voltage of the transistor) above the desired source voltage will permit current to flow from the drain of the transistor to the source. The current depends upon the voltage drop between drain and source. If the gate voltage is less than 0.7 volts above the source voltage, the transistor is considered "off" with only "off leakage current" can flow through the channel. In modern semiconductor process, the "off leakage current" is negligible. When the n-type transistor is used as a "digital switch", the gate voltage is typically set at ground (0 volt) to turn "off" the transistor and at the supply voltage to turn the transistor "on".

For example in the case of a n-type transistor having a 0.7 volt threshold operated with a constant gate voltage such as 3.3 volt and its source is connected to one side of a capacitor whose other side is connected to ground and its drain is connected to a supply voltage at 3.3 volts, the current will flow through the channel of the transistor charging the capacitor until the voltage at the source is about 0.7 volt below the gate voltage. (This is referred to as the transistor threshold and typical values, in modern semiconductor process, of the threshold are about 0.5~0.7 volts for the transistors to be operated with 3.3V supply voltage.) This will keep the source voltage at a voltage of about 0.7 volt below the gate voltage if the "off leakage current" is negligible.

Reset Clock Noise

In a typical CMOS sensor, each pixel's sensing node is typically reset many times per second (such as 30 times per seconds) to establish a reference (or reset) condition before each readout. A typical implementation of this reset function is to use a transistor as a "switch" whose gate is electrically connected to a control clock signal from a timing circuit on-chip or off-chip. This control clock signal typically is alternately "on" and "off" on a frame-by-frame basis or row-by-row basis. From the timing generation circuit of this reset clock signal to the channel of the reset transistor inside the pixel, there is impedance (including resistance and capacitance) along the path that is not always constant but may vary with time. It is well known that such impedance has noise associated with it. It is typically a major design task to reduce or eliminate such noise associated with the pixel reset.

Correlated Double Sampling

A known technique to eliminate clock noise is based on the fact that once the reset switch has been turned "off", the clock noise will not significantly change the condition at the sense node. This allows one to completely remove clock noise by "correlated double sampling" (CDS). CDS eliminates clock noise by differencing a sample taken from a reference level from a sample taken after a signal has been transferred to a sense node. We can eliminate reset noise to the sense node very effectively because noise is "correlated" between the two samples.

Uncorrelated and Correlated Double Sampling

Three Transistor Active Pixel Sensors—Uncorrelated Double Sampling

In the simplest CMOS active pixel sensor designs, there are rows and columns of pixels with a photodiode region and three transistors per pixel. In this design, the charge collection node, charge integration node and charge sensing node is the same node physically or electrically connected with negligible impedance. Two of the transistors are "passive" in nature, one of the "passive" transistors is used to reset the charge sensing/integration/collection node (the SIC node) and one is used to address each individual row of pixels. The third transistor is an active element functioning as a source-follower to provide a pixel output voltage based upon a charge signal at the SIC node produced in the photodiode region. In this three-transistor pixel circuit, reset and signal readouts occur in the following sequence: (1) reset the SIC node, (2) integrate charges for a period of time (exposure time), (3) select the row, (4) readout the pixel signal after illumination for every pixel within the selected row and (5) reset the SIC node of the selected row immediately and readout for the second time to establish a reference voltage level. The net pixel signal is defined by the differential between Steps 4 and 5. The difference between these signals can be determined using analog techniques before the signals are digitized or digitally after digitization. The purpose of Step 1 is to reset the SIC node to be free of carriers to establish a reference level before charge integration starts. The purpose of Step 5 is to reset the SIC node in order to establish a reference voltage level. The proper readout sequence ought to be "reset the SIC node" first before any readout of real signal voltage level. In this simplest three-transistor design, the charge integration node and charge sensing node circuit-wise is the same node. Therefore one can not perform Step 5 ahead of Step 4; if so, the charges integrated at the SIC node would be lost. As a result of it, one has no choice but to readout the signal voltage level first as done in Step 4 then reset and measure the reference voltage level. That is the purpose of Step 5. Unfortunately, one has no choice but to perform Step 5 after Step 4 in this simplest three-transistor pixel circuit. As a result uncertainty results from the noise associated with the reset to the SIC node occurring in between the two readout steps. Thus the signal and reference voltages are not correlated so this readout scheme is called un-correlated double sampling.

Four Transistor Active Pixel Sensors—Correlated Double Sampling

To achieve low noise sensing, it is desirable to make the readout totally correlated under which uncertainty due to the reset clock noise onto the charge sensing node can be cancelled completed. In order to do this, the first design goal is to isolate the charge integration node from the charge sensing node. This can be accomplished with a fourth transistor functioning as a switch to isolate the charge integration node from the charge sensing node. With such a design, one can then operate the pixel with the following sequence: (1) reset the charge integration node, (2) integrate charges for a certain period of time (exposure time), (3) reset the charge sense node, (4) select the row, (5) readout the signal at the charge sense node, (6) transfer the charge from the charge integration node to the charge sense node, and (7) readout the signal at the charge sense node the second time. This sequence is then repeated for other rows. Since there is no reset to the charge sense node between Steps (5) and (7); therefore, the signal detected at Step (7) is correlated to the "start condition" at Step (5). As a result of it, any uncertainty to the charge sensing node caused by the reset control signal on the reset transistor is avoided. Since the sense node is read twice in a correlated manner, once immediately after reset and once after the charges are transferred from the charge integration node, with no reset in between, this readout scheme is called correlated double sampling. The purpose of correlated double sampling is to eliminate the clock noise of the reset transistor $M_{RST}$ into the charge sensing node. In this four transistor pixel design, the charge integration node is reset only once in Step 1 before charge integration starts. This is typically done by closing the fourth transistor separating the charge integration node from the charge sensing node and resetting both nodes prior to the charge integration step. Typically, this reset is done on a row-by-row basis, which is called rolling shutter. If one uses a mechanical shutter with this kind of sensors, one can reset the charge integration nodes of all the pixels at the same time on a frame basis. After the integration time, one can then close the mechanical shutter and readout the signal one row of a time.

Four Transistor Pixel with Pinned Photodiode

FIG. 1 shows a prior art, four transistor CMOS active pixel sensor (APS) pixel cell with a pinned photodiode and a transfer-gate NMOS transistor similar to one described in U.S. Pat. No. 5,625,210. Charges generated in a pinned photodiode are collected and integrated at a charge integration node 102 and sensed at a charge sensing node 103. A transfer gate transistor 110, when turned off, isolates a charge sensing node 103 from charge integration node 102. The pinned photodiode is specially engineered such that, when the transfer gate is turned on, the integrated charges at charge integration node 102 can be completely transferred to the charge sensing node 103. The pinned photodiode is a conventional p-n junction with a top interface of the n region doped heavily with p-type doping. This floods the interface with holes which are immediately filled with electrons giving the interface a negative charge; as a result of this negative charge, all electrons accumulated at charge integration node 102 during the photon integration phase will be repelled from the interface region and transferred completely to the charge sensing node 103 when gate 110 is turned "ON" (i.e. when this switch is closed). This is to eliminate any in-sufficient charge transfer that could otherwise result in "image lag".

At the beginning of the operation, the photodiode at reset is reset to a known voltage reverse biasing photodiode $D_{ph}$ and establishing a reset potential at node 102 and at node 103. After reset, photo-generated and thermally-generated electrons start accumulating in the depletion regions of the p-n junction of the photodiode reducing the electric potential at node 102. This period of charge accumulation is referred to as a charge integration time. (The p-n junction thus is serving the function of a capacitor. In FIG. 1 Applicant illustrates this capacitive effect with a capacitor symbol $C_{STO}$. Applicant uses dashed lines here to represent an equivalent capacitor in order to distinguish it from a typical metal-insulator-metal capacitor. This equivalent capacitance is a by-product of a p-n junction and its effect needs to be considered in circuit simulations. This is a common practice in semiconductor industry. Of course, one can implement a conventional capacitor made of metal-insulator-metal and connected in between this node and ground. This would require an increase in the size of the pixel area so these conventional capacitors are not used in typical pixel designs. The total capacitance is the combination of the p-n junction capacitance plus any additional capacitance associated with any metal-insulator-metal type capacitance.) At the end of the charge integration time, charge sensing node 103 is reset. (This resetting has no effect on charge integration node 102 since switch 110 is turned off.) Then the signal level at the sense node 103 is read to establish a reference voltage. The next step is to pulse transfer switch 110 to transfer the integrated charge from the charge integration node 102 to charge sensing node 103. These pixels each include a diode $D_{SEN}$ at sensing node 103. This diode functions as a capacitor and as above Applicant indicates it capacitive effect with dashed lines. Then the signal at the charge sensing node 103 is read a second time. The differential between the voltage levels read before and after transistor switch 110 is pulsed represent the signal level detected by the photodiode. This readout technique is called correlated double sampling (CDS) with which any uncertainty related to the "reset to the sensing node 103" can be removed since both the reference voltage and signal voltage levels are all referred to the same condition at the charge sensing node 103 immediately after the reset and there is no reset to the sense node in between the reading of the reference voltage and the reading of the integrated signal voltage. This is the state of the art technique to achieve the lowest "pixel reset clock noise" known in the industry.

In this arrangement four NMOS transistors are required for each pixel cell, (i.e. reset transistor 111, source-follower transistor 112, row-select transistor 113, and transfer-gate transistor 110. A simplified cross-section view of the prior art pinned photodiode pixel is illustrated in FIG. 2. Even though this prior art can achieve the lowest "pixel reset noise", it suffers severely on the fill factor problem since its four transistors and photodiode are all formed side-by-side on the silicon substrate. They are competing for silicon real estate; i.e., for a given pixel size, if one uses more silicon areas for transistors, there would be less silicon area for photodiode.

Photodiode on Active Pixels

Applicant and his fellow workers have developed a series of CMOS sensors in which a photodiode layer is fabricated on top of an array of active CMOS pixels. Applicant refers to this technology as Photodiode on Active Pixel (POAP) sensor technology. By applying the photodiode layer on top of the active pixels, Applicant and his fellow workers have been able to achieve an almost 100 percent fill factor (which is the light sensitive portion of the pixel surface area). This has lead to an effective quantum efficiency ((fill factor)×(absolute quantum efficiency)) of these POAP sensors which is typically twice the quantum efficiency of other prior art sensors. Prior art patents describing various features of this POAP technology include the following U.S. patents: U.S. Pat. Nos. 6,730,900; 6,730,914; 6,691,130; 6,678,033; 6,809,358; and 7,196,391. All of the above U.S. patents are incorporated herein by reference.

However, the sensitivity of an imaging sensor is determined by the signal to noise ratio. High sensitivity can be achieved through either higher signal or lower noise. Applicant's prior POAP designs all use only three transistors, namely the reset, source-follower and row select transistors. In this three-transistor design, the charge collection node, charge integration node and charge sensing node is the same node. Because of this, Applicant's three-transistor based POAP can not do "correlated double sampling". As a result of it, Applicant's three-transistor based POAP has higher reset noise compared to the pinned photodiode based four-transistor described above. Because of the increase of reset noise, POAP's advantage in Effective Quantum Efficiency would be compromised. In this present invention, Applicant invents a novel circuit which enables a POAP based pixel to implement CDS readout. In conjunction with the CDS and its advantage in effective quantum efficiency, Applicant's present invention provides a pixel technology leading to an imaging sensor being of the world highest sensitivity since the present invention provides the highest signal (via the highest effective quantum efficiency) and the lowest reset noise (via CDS).

Sampling with Prior Art POAP Sensors

In a three-transistor pixel Photodiode On Active Pixel design, the charge integration sites and charge sensing nodes are electrically connected just like the three-transistor pixel in the conventional CMOS active pixel sensors and the sampling is uncorrelated as in the above described three-transistor sensors. This uncorrelated nature, of the three-transistor pixel (conventional CMOS or POAP-CMOS), results in higher clock noise by at least a factor 1.4 as compared to sensors capable of correlated double sampling. The sensitivity of an image sensor is judged by signal-to-noise ratio (SNR). Uncorrelated double sampling reduces the quantum efficiency advantage of the POAP sensors over other prior art sensors.

Bump Bonding

Bump bonding is a sensor technology relying on a hybrid approach. With this approach, the readout chip and the photo detector portions are developed separately, and the sensor is constructed by flip-chip mating (also called bump bonding) of the two. This method offers maximum flexibility in the development process, choice of fabrication technologies, and the choice of sensor materials.

The Need

What is needed is a sensor with a photo sensing layer having correlated double sampling capability.

SUMMARY OF THE INVENTION

The present invention provides a MOS or CMOS based active pixel sensor with special sampling features to substantially eliminate clock noise. The sensor includes an array of pixels fabricated in or on a substrate, each pixel defining a charge collection node on which charges generated inside a photodiode region are collected, a charge integration node, at which charges generated in said pixel are integrated to produce pixel signals, a charge sensing node from which reset signals and the pixel signals are sensed. In preferred embodiments the sensor includes a continuous electromagnetic radiation detection structure located above the pixel circuits providing a photodiode region for each pixel. The sensor includes integrated circuit elements adapted to maintain voltage potentials at the charge collection nodes substantially constant during charge integration cycles. The sensor also includes integrated circuit elements having electrical capacitance adapted to store charges providing an electrical potential at the charge integration node. In preferred embodiments this is a pinned diode. The sensor also includes a transfer switch to transfer charges from the charge integration node to the charge sensing node. The sensor also includes integrated circuit elements having electrical capacitance adapted to store charges providing an electrical potential at the charge sensing node. The sensor also includes integrated circuit elements adapted to reset the charge sensing node and the charge integration node, integrated circuit elements adapted to convert the charges on the charge sensing node into electrical signal, and integrated circuit elements adapted to readout electrical signals generated in the pixels.

One of the very important features of preferred embodiments of this invention is that the charge integration node and charge sensing node are separated from each other. This feature permits correlated double sampling that basically eliminate clock noise as a problem.

Another important feature of preferred embodiments of this invention is that Applicant also separates the charge collection node from the charge integration node. In this separation Applicant preferably uses a transistor whose gate is held at a substantially constant voltage, about 1.2 V, during the charge integration cycle. The applicant makes this bias voltage programmable in the range of 0.8V to 1.6V to fine tune the overall sensor performance. This transistor maintains the voltage at the charge collection node at a constant value. The charge collection node is considered electrically short to the pixel electrode. This constant voltage not only substantially eliminates pixel crosstalk but also eliminates the need to use the built-in capacitance of the photodiode to store signal charges. When the charge integration node is reset at the beginning of the integration cycle, this constant gate bias transistor allows current flowing from the charge integration node to the charge collection node until the charge collection node is charged up to slightly (a few tenths of a volt) below the constant gate bias. The capacitor associated with the integration node is reset to produce a potential at the integration node of about 2.6 volts at the beginning of the charge integration cycle in the preferred embodiment. After reset, the charge integration node is left "floating". The current flow to maintain the charge collection node at a constant voltage lowers the voltage at the charge integration node throughout the integration period. The amount of the voltage drop at the charge integration node is proportional to the amount of charges generated inside the photodiode. During charge integration cycle, electron-hole pairs will be generated with electrons migrating to the charge collection node and holes migrating to ground (through the surface electrode of the photodiode). Because of the accumulation of the additional electrons at the charge collection node, its voltage will drop. This will in effect "turn on" the constant gate biased transistor and let current flow from the charge integration node (electrically short to the drain of the constant gate biased transistor) until the voltage at the charge collection node (electrically short to the source of the constant biased transistor) goes back up to slightly (a few tenths of a volt) below the gate bias and then the current flow will stop.

This novel design resolves the concern of incomplete charge transfer on the charges stored on the photodiode (and its associated circuitry) since there is no charge transfer from the photodiode region during the signal readout cycles. This is especially important if the photodiode is on pixel circuitry (like POAP) where the charges stored on the photodiode needs to travel through vias and interlayer metal connectors in order to get to the charge sensing node. This travel path can not be fabricated with perfection in real practice; therefore, incomplete charge transfer is expected. Using a constant gate bias transistor to maintain the charge collection node at a constant value, eliminates the need of using the effective capacitance of the photodiode and any fringe capacitance along the conducting path from the photodiode to the charge collection node as a part of a charge integration capacitance. Therefore, since charges are not stored at, and readout from, the charge collection node; any imperfection of the path will not affect the signal integrity of the signal.

However, it is as important to provide substantially complete charge transfer from the charge integration node to the charge sensing node. To do this, Applicant in preferred embodiments heavily dopes the integration node storage p-n diode at the surface to fill the surface regions with holes to avoid or minimize electrons being trapped by the surface defects. This present invention uses only 5 transistors to provide CDS capability for Applicant's POAP pixel architecture. Applicant believes this invention provides an imaging sensor with the world highest sensitivity compared to all prior arts, including three-transistor CMOS, four-transistor CMOS with pinned photodiode and three-transistor POAP. The Applicants' present invention can also work as an "electronic shutter" which could not be provided by other CDS-capable sensors found in the prior art.

DETAILED DESCRIPTION OF PREFERRED EMBODIMENTS

First Preferred Embodiment—Five Transistor Design

Figure 4:
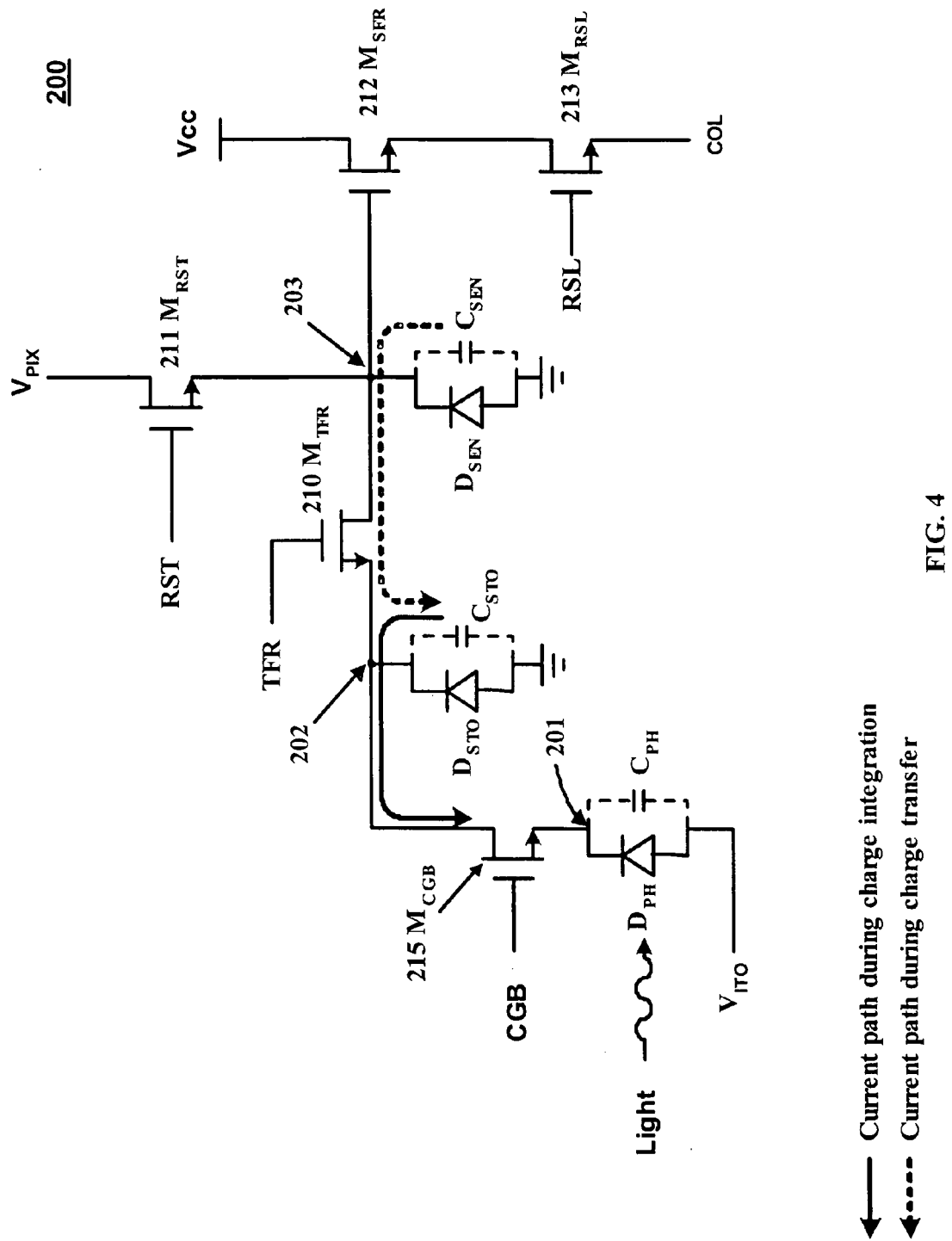
FIG. 4 is a five transistor pixel cell of a preferred embodiment of the present invention.
Figure 5:
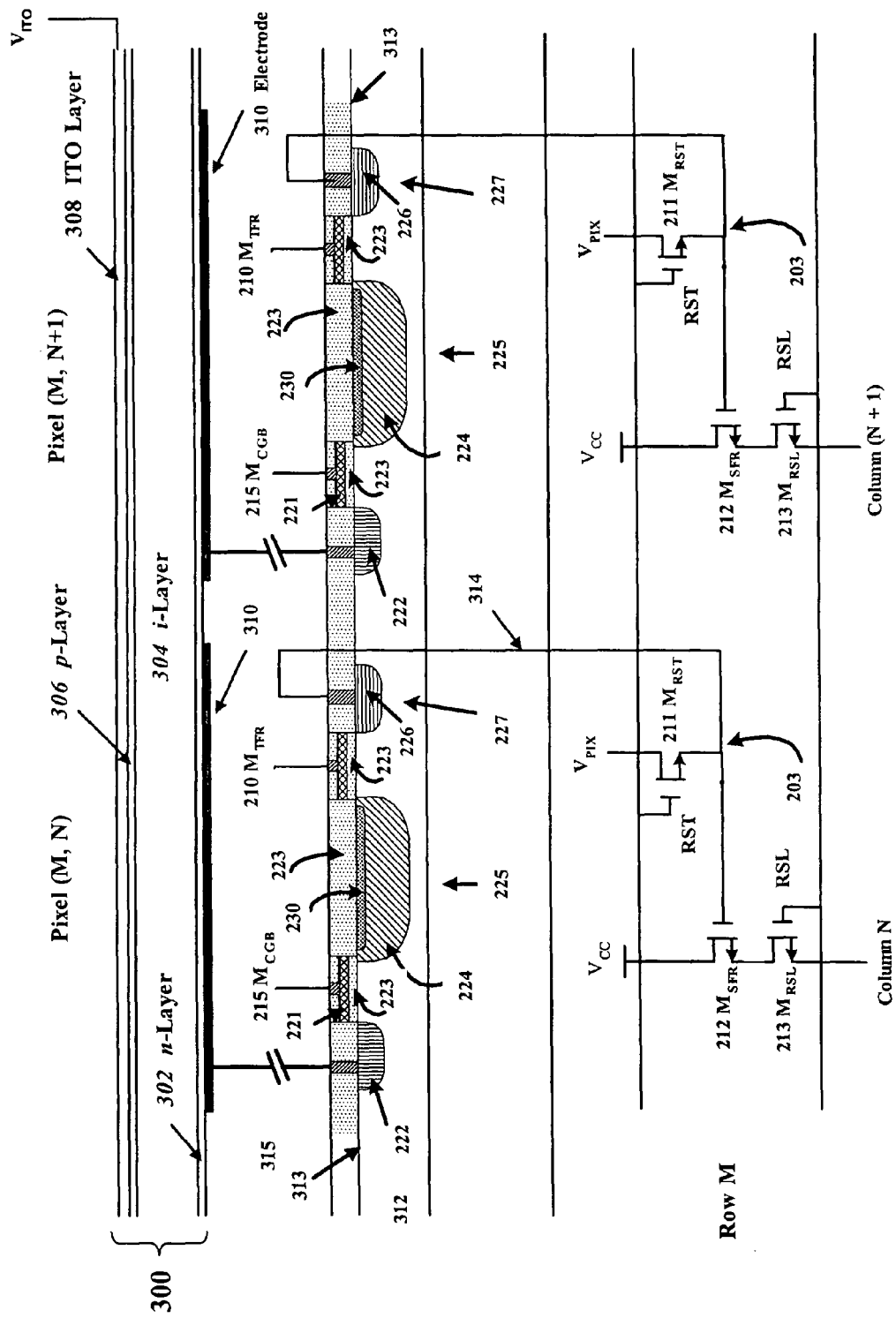
FIG. 5 is a simplified cross sectional view of two of the cells shown in FIG. 4.

A first preferred embodiment of the present invention is shown in FIG. 4 and FIG. 5. This embodiment combines features of the prior art POAP technology, pinning technology and correlated double sampling, all discussed in the background section to provide a sensor with approximately 100 percent packing factor and substantially zero clock noise. The result is a sensor with approximately 100 percent improvement in sensitivity over typical prior art CMOS sensors and a 40 percent improvement over prior art POAP sensors.

Pixel Structure

As shown if FIG. 5 a first preferred embodiment includes a four layer POAP type photodiode 300 covering all pixels in the pixel array. The four layers are an n-doped layer 302, an intrinsic i-layer 304, a p-doped layer 306 and an indium-tin-oxide (ITO) layer 308. The POAP structure also includes an electrode 310 for each individual pixel in the pixel array. A silicon oxide insulating layer 223 covers silicon substrate 312 in which the pixel circuits are created in the normal CMOS processes. The interface between p-type silicon substrate 312 (which may include an epitaxial-layer) and silicon oxide layer 223 defines silicon-silicon oxide interface 313. Between insulating layer 223 and the POAP structure 300 may be a stack of insulating layers 315 comprised of multiple silicon oxide layers in which connecting metal conductor lines are fabricated and interconnected through metal-filled via holes, as typically practiced in the semiconductor industry.

The Fifth Transistor

Figure 1:
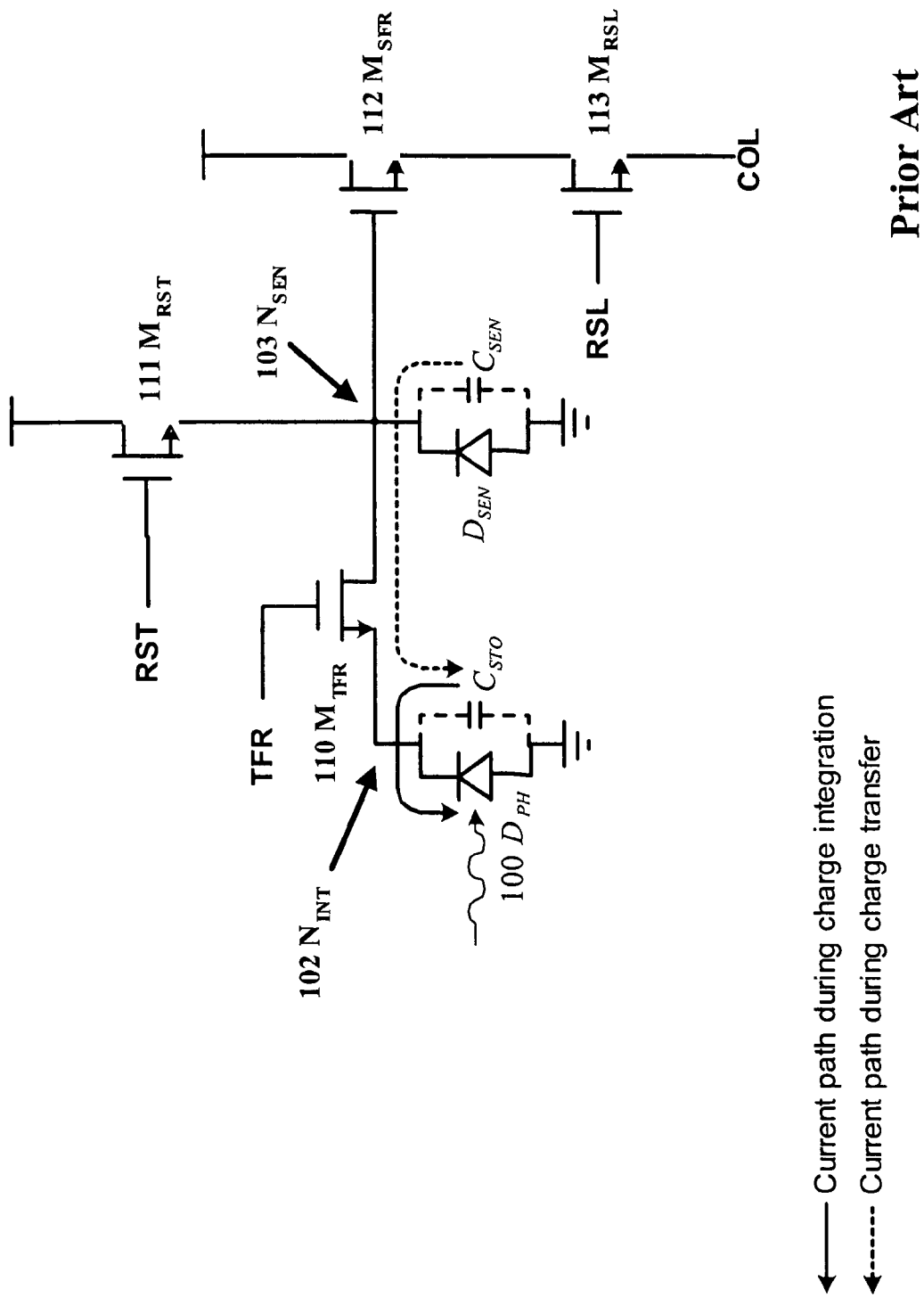
FIG. 1 shows a prior art four transistor CMOS active pixel sensor cell.

This preferred embodiment utilizes the four pixel transistor pixel design well known in the prior art and shown in FIG. 1. In addition Applicant adds a fifth transistor 215. This is a constant-gate-bias transistor that functions to isolate a charge collecting node 201 from a charge-integration node 202 and maintain the voltage drop between the charge collection node and the ITO layer 308 constant. The POAP structure, including the surface transparent electrode, p, i, and n layers and the bottom metal electrode, is only responsible for generating electron-hole pairs (electrical charges). The charge collecting node 201 now consists of the metal electrode 310 of the POAP photodiode structure and pixel conducting elements connecting electrode 201 to the rest of the pixel circuitry. The charge collecting node 201 includes a conductive n-type doping region 222. Transistor 215 is biased at a constant voltage to maintain the node 201 including region 222 at a constant voltage at all time. In practice this voltage is made programmable to fine tune the performance of the pixel empirically. This voltage is preferably programmable in the range of 0.8V to 1.6V. As explained in the background section, with this constant gate bias transistor, the transistor 215 would be operated under a condition under which, during integration cycles, any additional charges entering node 201 (i.e. electrons migrating from the photodiode regions above the pixels) would be swept through the channel of constant gate bias transistor 215 into the charge integration node 202 to maintain a constant voltage at node 201. Region 221, shown in crossed-wire pattern, is made of doped polysilicon to form the gate of the transistor 215. Region 223 is the silicon oxide. The other side of transistor 215 is charge integration node 202 and pinned diode 225.

Charge Integration Node with Pinned Diode

At the beginning of each cycle nodes 202 and 203 are reset to a potential of about 2.6 volts, slightly lower than $V_{RST}$ (the gate "ON" voltage which is at 3.3 volts and $V_{PIX}$ is at 3.3V in this example). Node 201 is at a potential determined by constant gate bias transistor 215 where the gate is maintained at about 1.2 volt providing a potential at node 201 of about a few tenths of a volt below the gate voltage. Excessive charges collected at charge collecting node 201 are integrated at charge integration node 202. Preferably charge integration node 202 is specially engineered so that, when the transfer-gate 210 is turned on, all of the charge collected at charge integration node 202 is completely transferred to charge sensing node 203. This is accomplished with pinned diode 225 that is made similar to the prior art pinned photodiode shown at 100 in FIGS. 1 and 2. The doping profile and the physical layout of this pinned diode are shown at 225 in FIG. 5. A portion of the silicon oxide-silicon interface 313 between silicon substrate 312 and silicon oxide layer 223 is heavily doped with p-type doping to fill the surface traps with holes. This results in a negative charge at the p-doped site to repel carrier electrons away from the interface. This principle has been practiced in the charge-coupled-device technology to improve charge transfer efficiency and these designs are referred to as "buried channel" designs. In the first preferred embodiment, the width of this pinned region is slightly smaller than the gap between the gate of 215 $M_{CGB}$ and 210 $M_{TFR}$. However, this can be optimized based upon the geometric layout of transistors 215 and 210 as well as the fabrication process resolution. This pinned diode 225 is not responsible for generating charges, but functions as a capacitor and is responsible only for integrating (i.e. storing) charges during the integration portion of the pixel operation cycle and releasing them to the charge sensing node at the end of the integration cycle.

Pinned diode 225 includes n-type region 224 created in p-type substrate 312. The p-type substrate 312 and the n-type region 224 form a p-n junction at which a built-in depletion region is free of carriers. The pixel is reset by closing reset switch 211 with transfer switch 210 also closed. This places a reverse bias on the p-n junction of pinned diode 225 that increases the size of the depletion region and determines the maximum charge storage capacity of the diode. After the reset this charge integration diode 225 is left floating by the opening of Switches 210 and 211. During charge integration, negative charges generated in the POAP diode flow from the charge collection node 201 into the depletion region of pinned diode 225 and are in effect stored on the charge integration node 202. During integration, charges are also generated thermally and are also accumulated in the depletion region of the pinned diode 225 and are integrated on charge integration node 202. Once the charges are integrated at node 202, one can not distinguish the origin of the charges whether they are optically or thermally generated. The thermally generated signal could become a problem if it is larger than the optically generated signal. In today's state of the art sensor technology, this thermally generated dark current density is typically less than 500 $pA/cm^2$. Its effect is usually negligible compared to the optically generated signal in typical imaging applications.

As explained above an interface region 230 between n-doped silicon region 224 and silicon oxide insulating layer 223 (shown as a dotted region in FIG. 5), it is doped heavily with p-type dopants. As explained above, this prevents any negative charge trapping near the interface region after transfer transistor 210 is turned "ON". The net effect is an almost complete charge transfer of charge from the charge integration node 202 to the charge sensing node 203 through transistor switch 210.

Charge Sensing Node

The charge sensing node 203 includes n-type doping region 226 inside p-type substrate layer 312 to form diode 227. Node 203 also includes interconnect vias and metal lines shown as conductors 314. Node 203 is also connected to the gate of the source follower transistor 212. The charges collected in the photodiode regions of each of the pixels during integration (as well as some additional thermally generated charges) when transferred to node 203 results in partial discharge of the effective capacitance of diode 227. This discharge results in an electrical potential at node 203 that corresponds to the reset potential minus a potential corresponding to the charges collected in the photodiode plus the thermally generated charges. This electric potential is placed on the gates of the respective source follower transistors 212 of each of the pixels. This charge is then amplified by the source follower circuitry as is the standard technique for these types of sensors as explained in the several patents referenced in the background section.

Correlated Double Sampling

Now that Applicant has explained the circuitry of this preferred embodiment, Applicant will now explain how that circuitry can be utilized to achieve correlated double sampling (CDS). After completion of integration and before the charge transfer step referred to above, reset transistor 211 is turned "ON" to reset sense node 203. The reader should note that transfer switch 210 is still open (turned off) so charge collection node 202 is unaffected. This is called reset-to-readout which is used to reset the sense node to a known reset potential. After that, row select transistor 213 is turned ON to readout the sensing node 226 to establish a reference voltage level.

After the reference voltage has been established, transfer transistor switch 210 is turned "ON" to transfer the charges from the charge integration node 202 to the charge sensing node 203. During the charge transfer the row select transistor 213 preferably remains "ON". (Keeping row select transistor switch 213 "ON" from the beginning of the first readout cycle through the charge transfer phase to the end of the second readout cycle can simplify the timing logic and avoids any possibility of charge injection effect when 213 is switched "OFF" and "ON" again. However turning switch 213 can be turned off briefly then on again for the second readout may be desirable in some cases.)

After the charge transfer is finished and all the charges stored on node 202 have been transferred to node 203, the transfer transistor switch 210 is then opened (i.e. turned OFF) to isolate charge sensing node 203 from charge integration node 202 again. At this time, charge sensing node 203 is readout a second time. The differential between the two voltage levels measured the first and second time is directly proportional to the charges integrated on node 203 (including the charges generated by the photodiode and the thermally generated charges). In this case we have sampled the sense node twice, one immediately after reset and one immediately after the integration signal reached the sense node. The two samplings are correlated because they are based upon the same reset potential established after the sensing node is reset before readout. And there is no reset in between samples. So we have achieved correlated double sampling!

After the second readout, the row select transistor 213 $M_{RSL}$ can then be turned "OFF". This cycle describe above for a single row of pixels is then repeated for all the rows.

Integration and Readout Cycle Step by Step Summary

A step-by step summary of the main steps of the sensor integration and readout cycle that has been explained above is provided below, using Row M as an example and referring to FIGS. 4 and 5. (In this example, a row-by-row based rolling reset is used. Readers should understand that alternative reset and readout schemes could be used such as a frame-based reset scheme.) In this example at all times, the transparent electrode (ITO) of the POAP layers is held at a constant voltage, typically at ground, and electrodes 310 are held at a constant potential of about a few tenths of one volt below the gate voltage by the constant gate bias transistor 215.

Step (1) Reset all pixels in Row M by closing (turning ON) both reset transistor switch 211 and transfer switch 210. Then open (turn off) both switches 211 and 210. Opening switch 210 isolates integration node 202 from sense node 203, and leaves node 202 "floating". After reset, the voltage potential at node 202 is at about 2.6 volts, about 700 mV lower than the "On" voltage of the reset gate ($V_{RST}$ which is at 3.3 volts to be "ON" and $V_{PIX}$ is also at 3.3V in this example).

Step (2) Allow current, resulting from charges produced in the respective portions of photodiode layer 300 associated with each pixel in Row M to flow from the integration node 202 through constant gate bias transistor 215 and the photodiode circuits to ground at surface electrode 308 reducing the electric potential at integration node 202. During this integration cycle, constant gate bias transistor 215 is operated to maintain node 201 at a constant voltage potential. This integration period lasts for a period sufficient to provide desired levels of illumination. In preferred embodiments this integration period, is programmable in a range from a few hundredths of a second to about two seconds.

Step (3) Close (turn on) row selection switches 213 in each pixel in Row M to select Row M for readout.

Step (4) Close (turn on) reset switches 211 to charge the effective capacitance of diode 227 to reset sense node 203 back to its "reset potential", about 2.6 volts (typically~700 mV, the threshold voltage of a typical transistor, below $V_{RST}$=3.3 volts and when $V_{PIX}$=3.3 volts in this example), for each of the pixels in Row M. Open (turn off) reset switches 211.

Step (5) Simultaneously readout (sample) the reset potential at sense nodes 203 for each pixel in Row M using column readout circuits (not shown) to establish the reference voltage level.

Step (6) Close (turn on) transfer switch 210 to produce a signal plus reset potential at sensor node 203 for each pixel in Row M. (In the preferred embodiment, the signal from the charge integration pinned diode would produce signal plus the reset potential in the range of about 0~1.5 volts lower than the reference voltage established in Step (5) depending on illumination at the respective pixels.

Step (7) Simultaneously (for each pixel in Row M) readout (sample) the signal plus the reset potential at sense node 203 utilizing column readout circuitry (not shown) then open (turn off) row selection switch 213. This ends the cycle for Row M for the current frame.

The reader should note that, for a given row, Steps (1) and (2) (i.e. reset of node 202 to begin the charge integration) occur prior to Steps (3) to (7) (i.e. readout of reset and readout of signal plus reset). In the row-by-row based reset design, within a line time, one row is selected to go through readout Steps (3) to (7) while all other rows continue to be selected for integration (Steps 1 and 2). The description of this row-by-row based rolling reset scheme is detailed in Applicant's patent application Ser. No. 11/389,356, Publication No. 2006/0164533 which is incorporated herein by reference.

Techniques for Determining the Signal Value

Subtracting Signal plus Reset from Reset to Get Signal

As a result of Steps 1 through 7 above values of "reset" and "signal plus reset" are obtained. The difference between these two values represent "signal" values corresponding to charges flowing through each pixel of the sensor for each frame. This difference can be obtained using analog or digital techniques, either "on chip" or "off chip" in a separate processor using techniques well known in the electronic image sensor art. Readers are referred to the patents referenced in the background for details.

With this CDS technique as explained above Applicant has effectively eliminated the reset clock noise which has been the biggest headache for people in the field attempting to achieve low noise imaging. The CDS is not intended to and can not eliminate the thermally generated noise inside the photodiode. This noise has been minimized through process improvement. Very fortunately, because of the rapid advancements in semiconductor technology thermally generated current (often referred as "dark leakage current") is in many cases negligible. And as explained below off chip techniques are known to correct for dark leakage current using calibration type techniques.

Electronic Shutter

Figure 2:
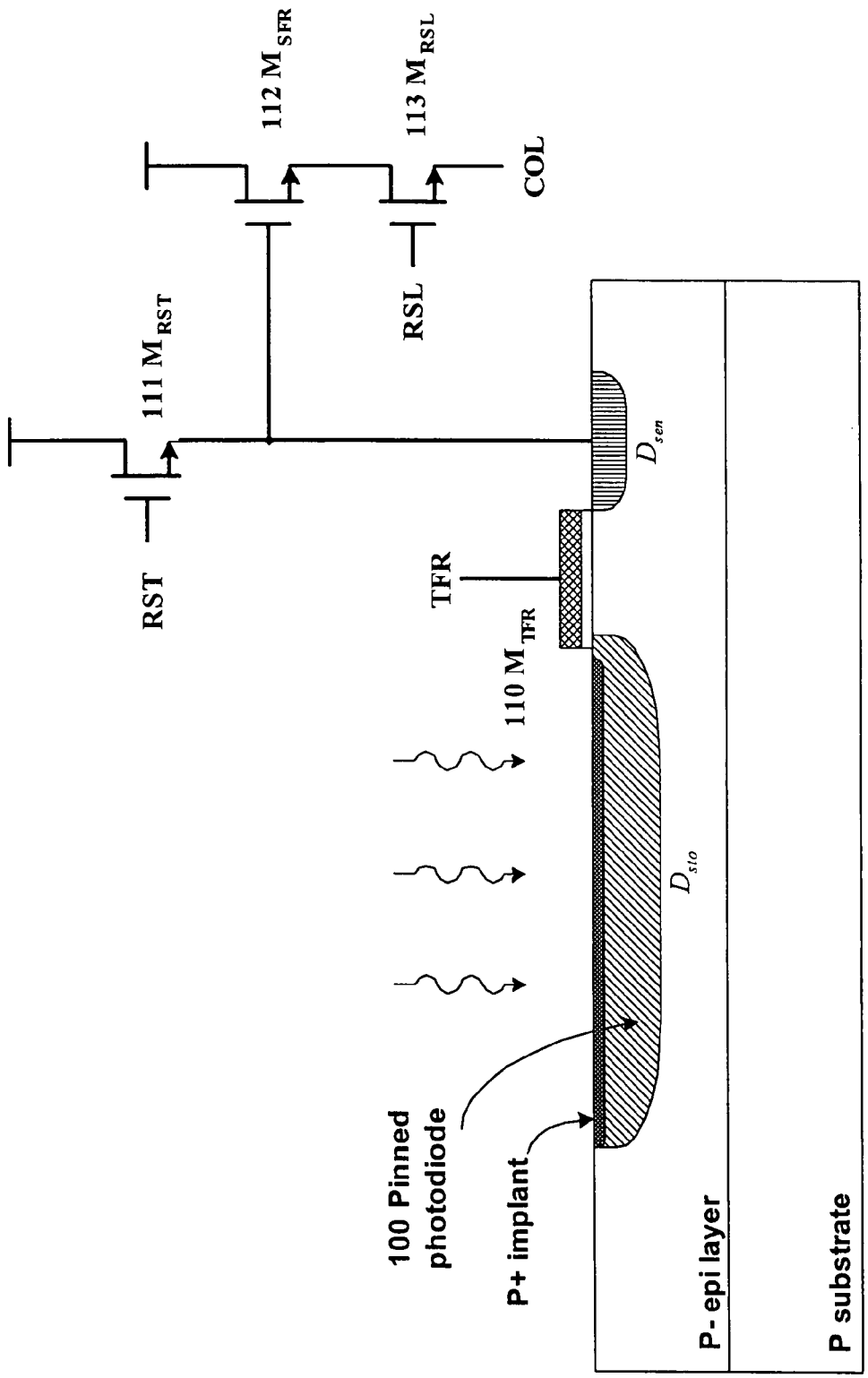
FIG. 2 is a simplified cross sectional view of the cell shown in FIG. 1.

In prior art sensors as described by FIGS. 1 and 2, the photodiode and the charge integration node are the same node. While the charge integration node of a row is readout, the charge integration nodes of the pixels in other rows are continuing charge integration. Without a mechanical shutter, this kind of sensors of the prior arts can not be reset globally on a frame basis. Their charge integration node is reset on a row rolling basis; i.e., a row is reset ahead to start the charge integration while another row is selected for readout within a line time.

Applicant's preferred embodiment, which implements a fifth transistor 215, the constant gate bias transistor, as shown in FIG. 5 to separate the charge collection node from the charge integration node, provides another important benefit. It can work as an electronic shutter. In this operational mode, Applicant resets the charge integration node of all the pixels all at the same time at the beginning of a frame. As a result all the pixels start the charge integration at the same time. During the charge integration cycle, the transistor 215 is operated under conditions to maintain a constant voltage at the charge collection node 201 allowing current to flow through the pixels to ground discharging charge integration node 202 without reducing the potential difference across the photodiode layer since the impedance from the charge collection node to the pixel electrode is negligible. At the end of the charge integration cycle, Applicant would then turn transistor 215 "OFF" by setting its gate voltage to 0 volt. The charges integrated at integration node 202 could then be readout slowly row-by-row without any interference by the continuous light exposure. This works like a shutter. This gives preferred embodiments of Applicant's present invention a unique feature, an electronic shutter, which is not available on other CDS-capable sensors in the prior art.

Transistor Sharing

As shown in FIGS. 4 and 5 the number of transistors per pixel to implement the above POAP pixel cell is five. However, the very fact that the transfer gate 210 isolates the charge integration node from the charge sensing node makes it possible to share one charge sensing node among a number of neighboring pixels. For example, one charge sensing node, as well as the associated three read-out transistors (the reset, the source-follower, and the row-select transistors) can be shared by 4 nearest neighboring pixels in different rows along the same column. As a result, the effective number of active transistors required for each pixel is 2.75 (i.e. the transfer-gate transistor+the constant-gate-bias transistors)+one fourth of the three readout transistors). A simplified pixel cell schematic is shown in FIG. 6, where $M_{CGB}$ is the constant-gatebias transistor, $M_{TFR}$ is the transfer-gate transistor, $M_{RST}$ is the reset transistor, $M_{SFR}$ is the source-follower transistor and $M_{RSL}$ is the row-select transistor.

Figure 6:
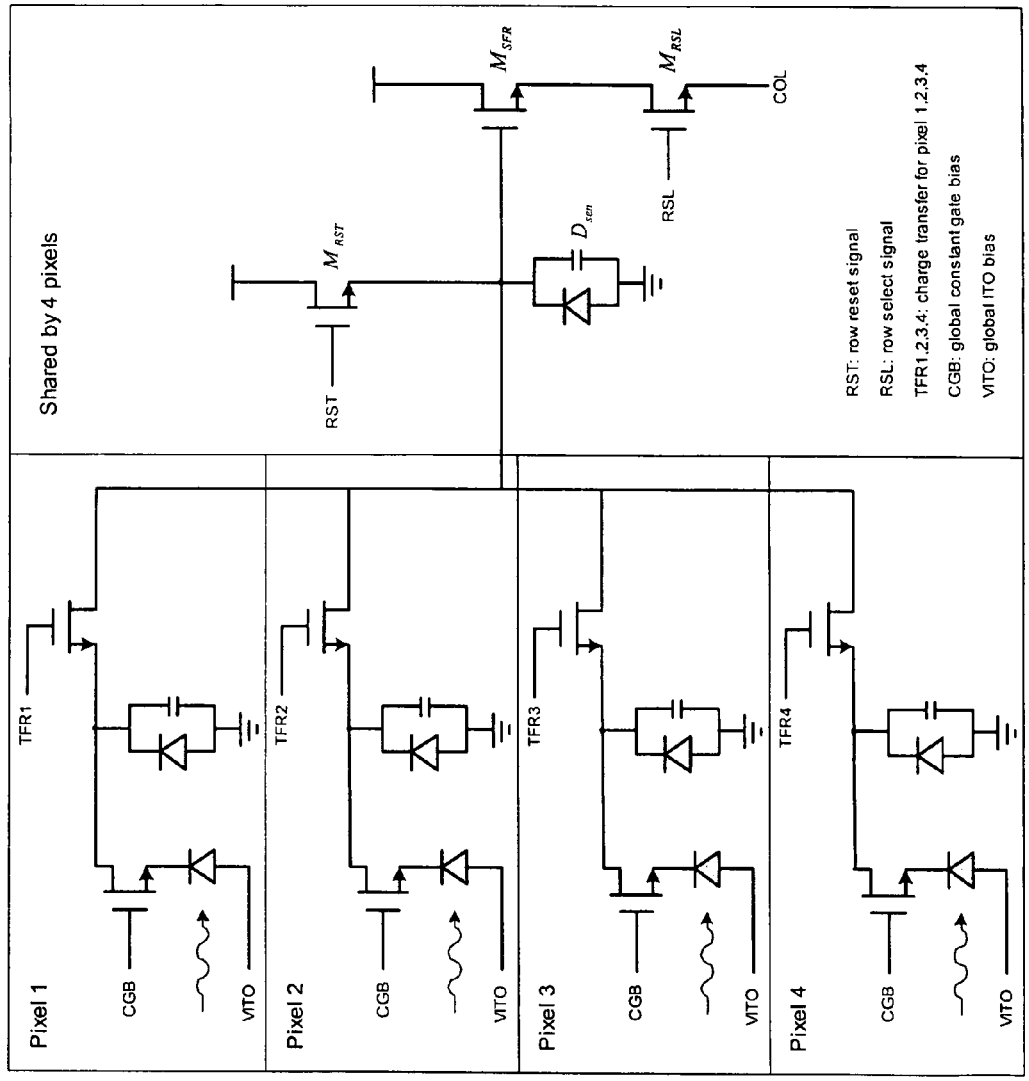
FIG. 6 is a drawing of a preferred embodiment utilizing readout circuits shared among four pixels.
Figure 7:
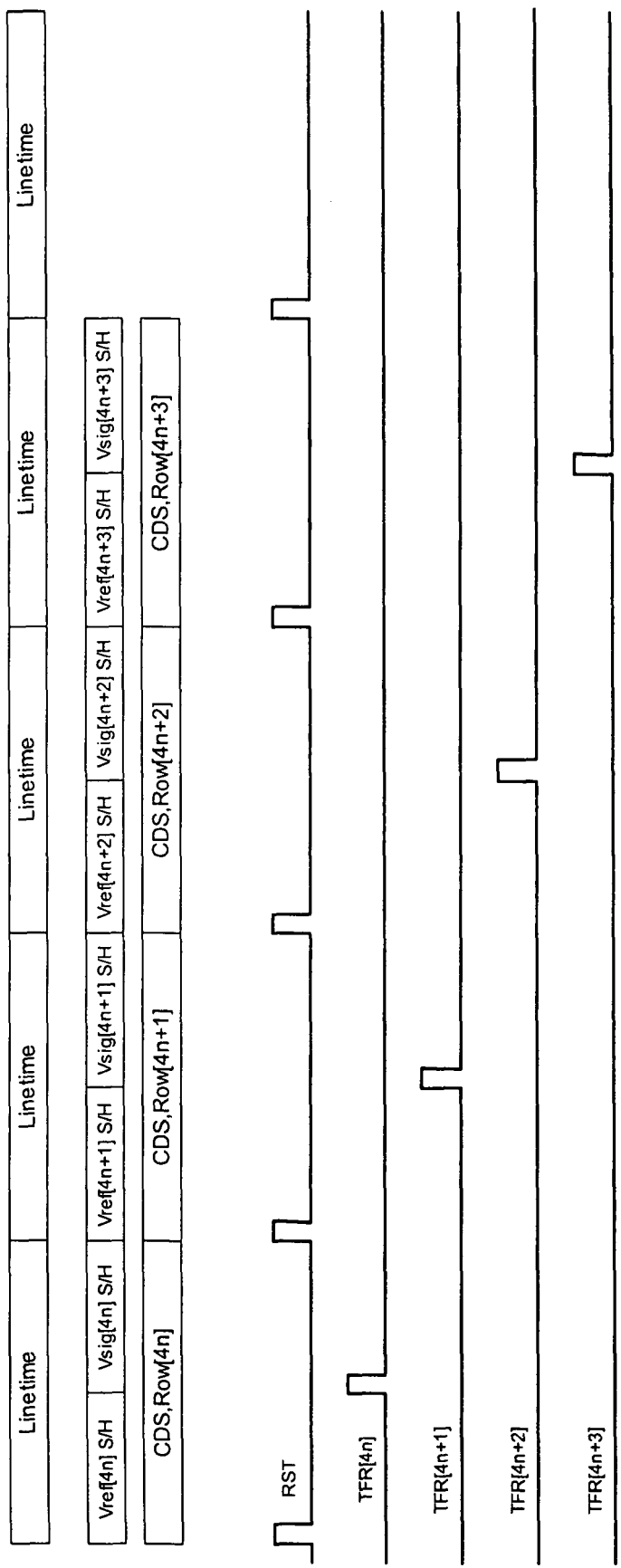
FIG. 7 is a drawing showing timing features of preferred embodiments.

A simplified timing diagram for correlated double sampling operation with the shared pixel design in FIG. 6 is shown in FIG. 7. The diagram shows the read-out of four adjacent rows where pixels on the same column share the same charge sensing node and 3 read-out transistors. $V_{REF}$[4n+i] represents the reference voltage level after the sample-and-hold (S/H) in the $(4n+i)^{th}$ line, where i=0, 1, 2 or 3. $V_{SIG}$[4n+i] represents the signal voltage level after the sample-and-hold (S/H) in the $(4n+i)^{th}$ line, where i=0, 1, 2 or 3. The read-out of these 4 rows is accomplished in 4 lines time; each of the transfer-gate transistors (TFR)i is turned on, one in each line-time, by a control pulse TFR[4n], TFR[4n+1], TFR[4n+2], and TFR[4n+3], sequentially. During the read-out of each line, the reset pulse is first "ON" to reset the charge sensing node, and the reference voltage level is established first. Then, the transfer pulse is turned "ON", and the collected charge is completely transferred to the shared charge-sensing node, and the signal voltage level is read out. This way, clock noise generated by the reset signal to the charge sensing node goes into both of the reference voltage level and signal voltage level identically (two voltage levels are completely correlated), which can then be eliminated by either analog or digital subtraction.

Bump Bonded Hybrid Sensors

Figure 8:
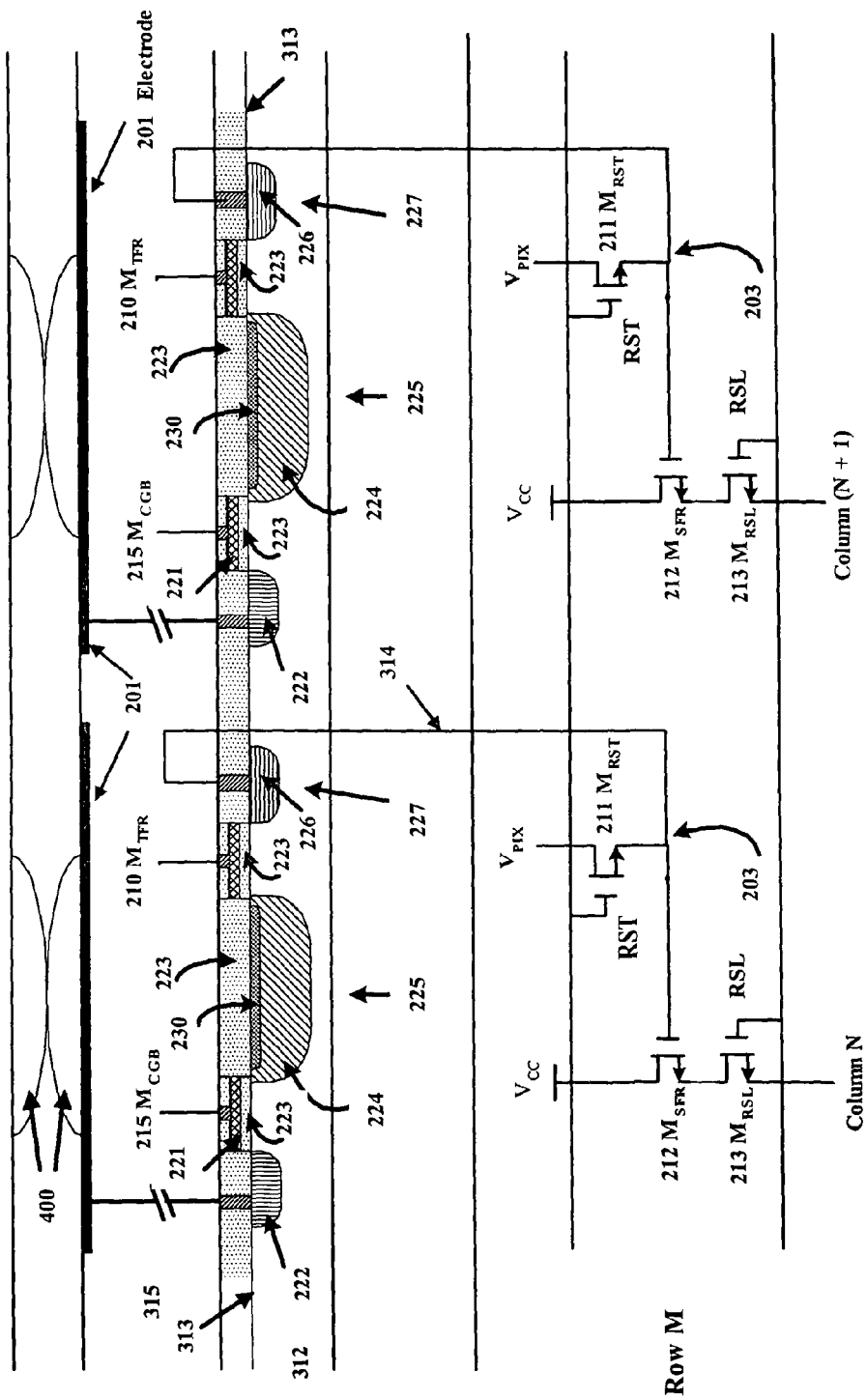
FIG. 8 is a drawing illustrating the utilization of the present invention with a bump bonded photon sensing layer.

As described in the background section bump bonding is a sensor technology relying on a hybrid approach. With this approach, the readout chip and the photo detector portions are developed separately, and the sensor is constructed by flip-chip mating (also called bump bonding) of the two. This method offers maximum flexibility in the development process, choice of fabrication technologies, and the choice of sensor materials. FIG. 8 shows a preferred embodiment of the present invention in which metal solder balls 400 serve as the pixel electrodes which are flipped bonded to a separately fabricated photodiode layer. In a particular preferred embodiment the separately fabricated photodiode layer is an InGaAs photodiode layer. This layer extends the spectral range on the sensor deeply into the near infrared portion of the spectrum. Other photon sensing layer structures can be bonded to the active pixel circuit array as shown in FIG. 8.

Four Transistor Design

Figure 3:
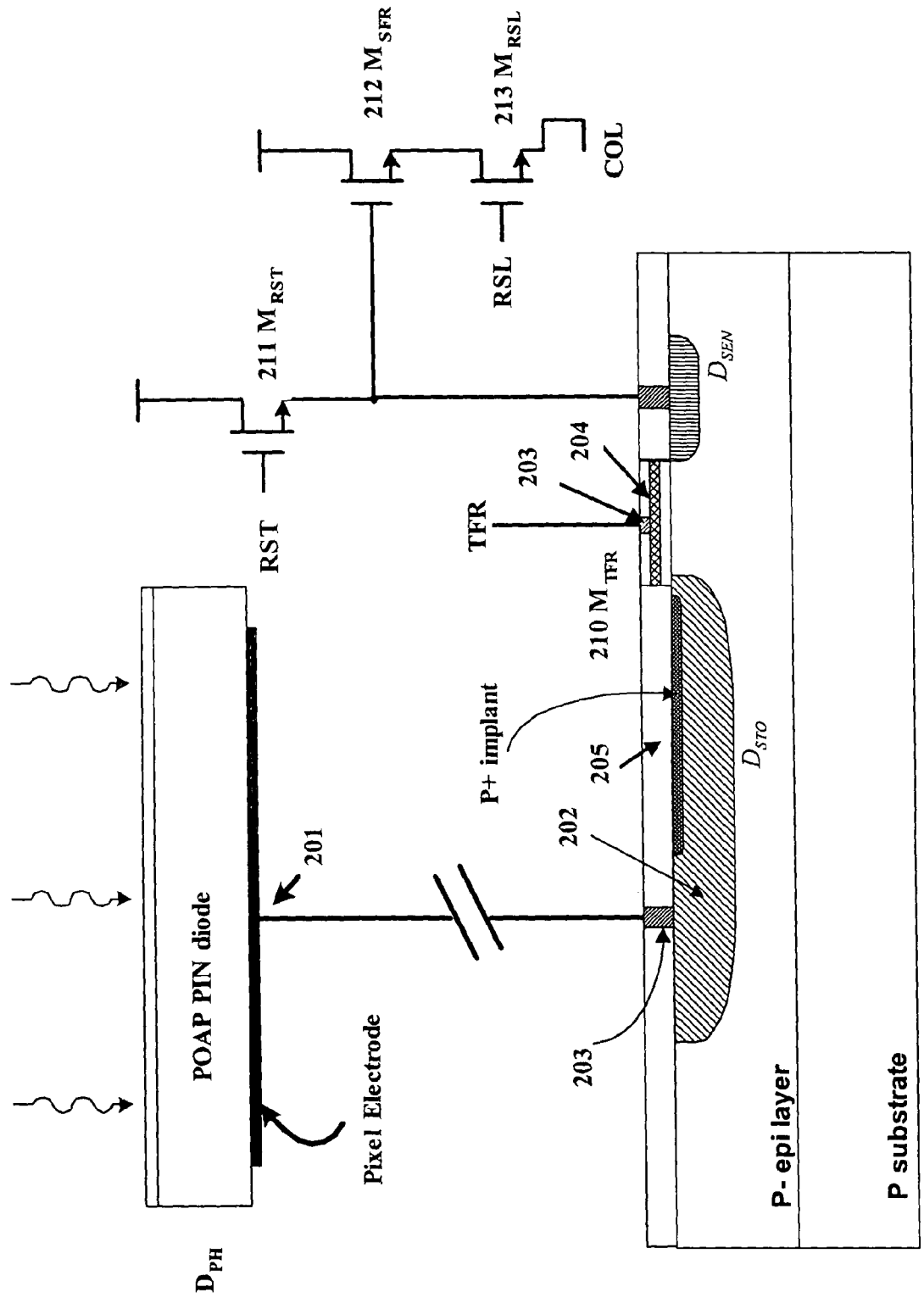
FIG. 3 is a four transistor pixel cell utilizing POAP technology.

In this embodiment, a four transistor pixel design is provided. This embodiment is substantially the same as the embodiment shown in FIGS. 4 and 5 except constant gate bias transistor 215 is left out. This has the effect of combining charge collecting node 201 and charge integrating node 202. A drawing showing the features is shown in FIG. 3. Note what was nodes 201 and 202 is now node 201A. The pixel electrode potential (as measured relative to surface electrode layer 308) will not be constant during charge integration but will decrease as charge varies at node 201A. As in the five transistor design, a portion 230 of n-type region 224 of pinned diode 225 is doped heavily with p-type doping at the interface between silicon oxide insulation layer 223 and n-type region 224 and Si substrate to pin the surface with holes to facilitate the complete charge transfer when transistor 210 is turned "ON". Readers should recognize that with this configuration complete charge transfer from node 201A to charge sensing node 203 will be difficult to achieve. This is because charges stored across the photodiode will encounter many imperfections along the path from node 201A to node 203. However, there may be many applications where this design may be preferable to the design as shown in FIGS. 4 and 5 or a new improved fabrication process may be developed that makes defect trapping, of signal carriers along the signal carrier travel path, negligible during signal readout cycle. Due to fewer transistors, production chips may be less expensive because chip yield are greater. The pixels could be made somewhat smaller and readout could be slightly quicker. Errors caused by less that 100 percent transfer can be mitigated downstream with software and careful calibration.

While there have been shown what are presently considered to be preferred embodiments of the present invention, it will be apparent to those skilled in the art that various changes and modifications can be made herein without departing from the scope and spirit of the invention. For example, the polarity of the photodiode layer could be reversed so that holes are collected on the pixel electrodes during pixel integration. The photodiode layer can be patterned by photolithographic means to define the boundaries of individual pixel, instead of a continuous un-patterned photodiode layer. The sensor could be adapted for imaging ultraviolet light or x-rays by use of appropriate ultraviolet or x-ray absorbing material in the photodiode layer, especially the i-layer. Also, the sensor could be adapted for imaging x-ray by applying a surface layer (such as cesium iodide) adapted to absorb x-rays and to produce lower energy radiation that in turn is converted into electrical charges in the photodiode layer. Many CMOS circuit designs currently in use could be adapted using the teachings of the present invention to produce many million pixel arrays. The signal charges can be holes instead of electrons; the charge integration diode can be pinned or not pinned (especially if a perfect Si—SiO interface can be made someday); the charge sensing diode can be pinned; a metal-insulator-metal capacitor may be provided in parallel to the p-n junction diode to provide additional effective capacitance of the charge sensing node; there can be a metal-insulator-metal capacitor made in parallel to the pinned diode for charge integration to increase the charge storage capacity at that node. We can use combination of p-MOS and n-MOS transistors to implement the reset transistor and row select transistor. We can use multiple transistors to implement the source-follower circuit; we can add additional transistors other than the transistors described above to add new functionality on a pixel level, such as analog-to-digital conversion, peak detection, voltage thresholding and demodulation. In the preferred embodiment, shown in FIGS. 4 and 5, the Applicant describes a mode with which the drain of the reset transistor (denoted as $V_{PIX}$) is set at the supply voltage (3.3V). When the reset transistor $M_{RST}$ is turned ON (under which its gate is set at the supply voltage (3.3V), the sense node will be reset to 2.6V (700 mV, the threshold voltage of a transistor, below the gate voltage). This is known in the industry as "soft reset"; and it is known in the industry that "soft reset" provides better noise immunity but poor linearity when the signal is small. To combat the linearity problem, one alternative operation mode is to set $V_{PIX}$ at least 700 mV (the threshold voltage) below the "ON" voltage of the gate (3.3V). Typically, one would set $V_{PIX}$ at 2.2~2.4V to avoid the variation of threshold voltage due to process. This is called "Hard Reset". Under hard reset mode, the sense node will be reset to $V_{PIX}$. It is also known in the industry that Hard Reset is good for linearity but has poor performance in "noise immunity". One can also combine the hard and soft reset within a sense node reset cycle to achieve a compromised performance in "linearity" and "noise immunity". All of these modes, hard reset, soft reset, hard and soft combination, can be used with this present invention to achieve the desirable performance required in different applications. Of course, the applicant uses 3.3V and 700 mV to describe the supply voltage and the threshold voltage of the transistor only as example. The people skilled in the field are aware that the threshold voltage can vary from one CMOS process to another and the supply voltage can be different from 3.3V. One can even use transistor of different threshold voltage separately for the constant gate bias, reset, row-select, transfer and source follower transistors in the pixel circuit. These variants are also obvious derivatives of the preferred embodiment.

Therefore, the scope of the invention should be determined by the appended claims and their legal equivalents and not by the examples that have been given.

What is claimed is:

1. A MOS or CMOS based active pixel sensor comprising:
A) a substrate;
B) an array of pixels fabricated in or on said substrate, each pixel comprising a plurality of integrated circuits defining:
  1) a charge collection node on which charges generated inside the photodiode are collected,
  2) a charge integration node, at which charges generated in said each pixel are integrated to produce pixel signals,
  3) a charge sensing node from which reset signals and the pixel signals are sensed;
C) an electromagnetic radiation detection structure located above said pixel circuits for converting electromagnetic radiation into charges during charge integration cycles, said electromagnetic detection structure defining a photodiode region for each of said pixels, comprising:
  1) a pixel electrode for each pixel,
  2) at least one layer of charge generating material to generate charges upon the absorption of electromagnetic radiation, and
  3) a surface electrode in the form of a thin transparent layer or grid located above said layer of charge generating material;
wherein said plurality of integrated circuits of each of said pixels comprises:
  1) integrated circuit elements adapted to maintain voltage potentials of said charge collection nodes substantially constant during charge integration cycles,
  2) integrated circuit elements having electrical capacitance adapted to store charges providing an electrical potential at said charge integration node,
  3) integrated circuit elements adapted to control the transfer of charges from the charge integration node to the charge sensing node,
  4) integrated circuit elements having electrical capacitance adapted to store charges providing an electrical potential at said charge sensing node,
  5) integrated circuit elements adapted to reset said charge sensing node,
  6) integrated circuit elements adapted to convert the charges on the charge sensing node into electrical signal, and
  7) integrated circuit elements adapted to readout electrical signals generated in said pixels.

2. The sensor as in claim 1 wherein said at least one layer of charge generating material is comprised of an n-doped amorphous silicon, an intrinsic amorphous layer, and a p-doped amorphous silicon layer.

3. The sensor as in claim 2 said surface electrode is a continuous layer comprised of indium tin oxide.

4. The sensor as in claim 3 wherein said pixel electrode is a metalized region in electrical, communication with pixel circuit elements.

5. The sensor as in claim 1 wherein said integrated circuit elements adapted to maintain voltage potentials of said charge collection nodes substantially constant during charge integration cycles comprise a constant bias transistor.

6. The sensor as in claim 1 said integrated circuit elements having electrical capacitance adapted to store charges providing an electrical potential at said charge integration node comprise a first diode.

7. The sensor as in claim 6 wherein said first diode is a pinned diode,

8. The sensor as in claim 7 wherein said substrate is doped with a dopant of a first kind to define a first doped region with a first doping concentration.

9. The sensor as in claim 8 wherein said pinned diode is further comprised of a second doped region of a dopant of a second kind inside the said first doped region and a third doped region of dopant of said first kind inside the said second doped region and adjacent to an interface between said substrate and its above dielectric layer and having a doping concentration higher than said first doping concentration.

10. The sensor as in claim 9 wherein said interface is an interface between a silicon substrate and an insulating dielectric layer.

11. The sensor as in claim 1 wherein said integrated circuit elements adapted to control the transfer of charges from the charge integration node to the charge sensing node comprise a transistor.

12. The sensor as in claim 1 said integrated circuit elements having electrical capacitance adapted to store charges providing an electrical potential at said charge sensing node comprise a second diode.

13. The sensor as in claim 1 wherein said integrated circuit elements adapted to reset said charge sensing node comprise a transistor.

14. The sensor as in claim 1 wherein said integrated circuit elements adapted to convert the charges on the charge sensing node into electrical signal comprise a source follower transistor.

15. The sensor as in claim 1 wherein said integrated circuit elements adapted to readout signals electrical signals generated in said pixels comprise a row select transistor.

16. The sensor as in claim 1 wherein said integrated circuit elements adapted to reset said charge sensing node is also adapted to permit reset said charge integration node.

17. The sensor as in claim 1 wherein said sensor is comprised of additional integrated circuit elements adapted to permit correlated double sampling.

18. The sensor as in claim 1 wherein said substrate comprises an upper epitaxial layer. electrical signals generated in said array of pixels.

19. The sensor as in claim 1 wherein said radiation detection structure is comprised of a plurality of photon sensing layers deposited over said array of pixels.

20. The sensor as in claim 1 wherein said radiation detection structure is comprised of a separately fabricated structure that is bonded to said array of pixels.

21. The sensor as in claim 1 wherein said electrical capacitance of said integrated circuit elements adapted to store charges is further comprised of conductor-insulator type capacitance.

22. A MOS or CMOS based active pixel sensor comprising:
  A) a substrate;
  B) an array of pixels fabricated in or on said substrate, each pixel comprising a plurality of integrated circuits defining:
    1) a charge collection node on which charges generated inside the photodiode are collected,
    2) a charge integration node, at which charges generated in said each pixel are integrated to produce pixel signals,
    3) a charge sensing node from which reset signals and the pixel signals are sensed;
  C) an array of pixel readout circuits fabricated in or on said substrate, each pixel readout circuits comprising a plurality of integrated circuits defining a charge sensing node from which reset signals and the pixel signals are sensed;
  D) an electromagnetic radiation detection structure located above said pixel circuits for converting electromagnetic radiation into charges during charge integration cycles, said electromagnetic detection structure defining a photodiode region for each of said pixels, comprising:
    1) pixel electrode for each pixel,
    2) at least one layer of charge generating material to generate charges upon the absorption of electromagnetic radiation, and
    3) a surface electrode in the form of a thin transparent layer or grid located above said layer of charge generating material;
  wherein said plurality of integrated circuits of each of said pixels comprises:
    1) integrated circuit elements adapted to maintain voltage potentials of said charge collection nodes substantially constant during charge integration cycles,
    2) integrated circuit elements having electrical capacitance adapted to store charges providing an electrical potential at said charge integration node,
    3) integrated circuit elements adapted to control the transfer of charges from the charge integration node to the charge sensing node,
  wherein said plurality of integrated circuits of said plurality of pixel readout circuits comprises:
    1) integrated circuit elements having electrical capacitance adapted to store charges providing an electrical potential at said charge sensing node,
    2) integrated circuit elements adapted to reset said charge sensing node,
    3) integrated circuit elements adapted to convert the charges on the charge sensing node into electrical signal, and
    4) integrated circuit elements adapted to readout electrical signals generated in said pixels.

23. The sensor as in claim 22 wherein each of said plurality of pixel readout circuits is shared by a plurality of said pixel circuits.

24. The sensor as in claim 22 wherein said radiation detection structure is comprised of a plurality of photon sensing layers deposited over said array of pixels.

25. The sensor as in claim 22 wherein said radiation detection structure is comprised of a separately fabricated structure that is bonded to said array of pixels.

26. The sensor as in claim 22 wherein said electrical capacitance of said integrated circuit elements adapted to store charges is further comprised of conductor-insulator-conductor type capacitance.

27. A MOS or CMOS based active pixel sensor comprising:
  A) a substrate;
  B) an array of pixels fabricated in or on said substrate, each pixel comprising a plurality of integrated circuits defining:
    1) a charge collection node on which charges generated inside the photodiode are collected,
    2) a charge integration node, at which charges generated in said each pixel are integrated to produce pixel signals,
    3) a charge sensing node from which reset signals and the pixel signals are sensed;
  C) an electromagnetic radiation detection structure located above said pixel circuits for converting electromagnetic radiation into charges during charge integration cycles, said electromagnetic detection structure defining a photodiode region for each of said pixels, comprising:
    1) a pixel electrode for each pixel,
    2) at least one layer of charge generating material to generate charges upon the absorption of electromagnetic radiation, and
    3) a surface electrode in the form of a thin transparent layer or grid located above said layer of charge generating material;
  wherein said plurality of integrated circuits of each of said pixels comprises:
    1) a constant gate bias transistor adapted to maintain voltage potential of said charge collection nodes substantially constant during charge integration cycles,
    2) a pinned diode having electrical capacitance adapted to store charges providing an electrical potential at said charge integration node,
    3) a transfer transistor switch adapted to control the transfer of charges from the charge integration node to the charge sensing node,
    4) a diode having electrical capacitance adapted to store charges providing an electrical potential at said charge sensing node,
    5) a reset transistor adapted to reset said charge sensing node,
    6) a source follower transistor adapted to convert the charges on the charge sensing node into electrical signal, and
    7) a row readout transistor switch adapted to readout electrical signals generated in said array of pixels.

28. The sensor as in claim 27 wherein said radiation detection structure is comprised of a plurality of photon sensing layers deposited over said array of active-pixels.

29. The sensor as in claim 27 wherein said radiation detection structure is comprised of a separately fabricated structure that is bonded to said array of pixels.

30. The sensor as in claim 27 and further comprising a capacitor comprised of conductor-insulator-conductor type used in parallel to said pinned diode adapted to store charges.

31. A MOS or CMOS based active pixel sensor comprising:
  A) a substrate;
  B) an array of pixels fabricated in or on said substrate, each pixel comprising a plurality of integrated circuits defining:
    1) a charge collection node on which charges generated inside the photodiode are collected,
    2) a charge integration node, at which charges generated in said each pixel are integrated to produce pixel signals,
    3) a charge sensing node from which reset signals and the pixel signals are sensed;
  C) an array of pixel readout circuits fabricated in or on said substrate, each pixel readout circuits comprising a plurality of integrated circuits defining a charge sensing node from which reset signals and the pixel signals are sensed;

D) an electromagnetic radiation detection structure located above said pixel circuits for converting electromagnetic radiation into charges during charge integration cycles, said electromagnetic detection structure defining a photodiode region for each of said pixels, comprising:
1) a pixel electrode for each pixel,
2) at least one layer of charge generating material to generate charges upon the absorption of electromagnetic radiation, and
3) a surface electrode in the form of a thin transparent layer or grid located above said layers of charge generating material;

wherein said plurality of integrated circuits of each of said pixels comprises:
1) a constant gate bias transistor adapted to maintain voltage potentials of said charge collection nodes substantially constant during charge integration cycles,
2) a pinned diode having electrical capacitance adapted to store charges providing an electrical potential at said charge integration node,
3) a transfer transistor switch adapted to control the transfer of charges from the charge integration node to the charge sensing node, wherein said plurality of integrated circuits of said plurality of pixel readout circuits comprises:
1) a diode having electrical capacitance adapted to store charges providing an electrical potential at said charge sensing node,
2) a reset transistor switch adapted to reset said charge sensing node,
3) a source follower transistor adapted to convert the charges on the charge sensing node into electrical signal, and
4) a row readout switch adapted to readout electrical signals generated in said pixels.

32. The sensor as in claim 31 wherein said radiation detection structure is comprised of a plurality of photon sensing layers deposited over said array of pixels.

33. The sensor as in claim 31 wherein said radiation detection structure is comprised of a separately fabricated structure that is bonded to said array of pixels.

34. The sensor as in claim 22 and further comprising a capacitor made of conductor-insulator-conductor type used in parallel to said pinned diode adapted to store charges.

\* \* \* \* \*